United States Patent
Chen et al.

(10) Patent No.: US 11,621,317 B2
(45) Date of Patent: Apr. 4, 2023

(54) SEMICONDUCTOR DEVICE STRUCTURE WITH MAGNETIC ELEMENT COVERED BY POLYMER MATERIAL

(71) Applicant: Taiwan Semiconductor Manufacturing Company, Ltd., Hsinchu (TW)

(72) Inventors: Chi-Cheng Chen, Tainan (TW); Wei-Li Huang, Pingtung (TW); Chun-Yi Wu, Tainan (TW); Kuang-Yi Wu, Changhua County (TW); Hon-Lin Huang, Hsinchu (TW); Chih-Hung Su, Tainan (TW); Chin-Yu Ku, Hsinchu (TW); Chen-Shien Chen, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 51 days.

(21) Appl. No.: 17/402,889

(22) Filed: Aug. 16, 2021

(65) Prior Publication Data
US 2021/0376054 A1 Dec. 2, 2021

Related U.S. Application Data

(62) Division of application No. 16/432,625, filed on Jun. 5, 2019, now Pat. No. 11,094,776.
(Continued)

(51) Int. Cl.
*H01L 27/22* (2006.01)
*H01L 49/02* (2006.01)
(Continued)

(52) U.S. Cl.
CPC ........... *H01L 28/10* (2013.01); *H01F 41/046* (2013.01); *H01L 21/76823* (2013.01);
(Continued)

(58) Field of Classification Search
CPC ......... H01L 21/67709; H01L 21/76823; H01L 23/3114; H01L 23/3171; H01L 23/53204;
(Continued)

(56) References Cited

U.S. PATENT DOCUMENTS 7,470,927 B2 12/2008 Lee et al.
9,691,544 B2 6/2017 Sun
(Continued)

OTHER PUBLICATIONS

U.S. Office Action for U.S. Appl. No. 16/260,599, dated Dec. 12, 2019.
(Continued)

*Primary Examiner* — Hoai V Pham
(74) *Attorney, Agent, or Firm* — Birch, Stewart, Kolasch & Birch, LLP

(57) ABSTRACT

A semiconductor device structure is provided. The semiconductor device structure includes a semiconductor substrate and a magnetic element over the semiconductor substrate. The semiconductor device structure also includes an isolation layer covering the magnetic element and a portion of the semiconductor substrate. The isolation layer contains a polymer material. The semiconductor device structure further includes a conductive line over the isolation layer and extending exceeding edges of the magnetic element.

20 Claims, 8 Drawing Sheets

Related U.S. Application Data

(60) Provisional application No. 62/725,695, filed on Aug. 31, 2018.

(51) Int. Cl.

| | |
|---|---|
| *H01F 41/04* | (2006.01) |
| *H01L 23/00* | (2006.01) |
| *H01L 21/768* | (2006.01) |
| *H01L 23/31* | (2006.01) |
| *H01L 23/532* | (2006.01) |

(52) U.S. Cl.
CPC ...... *H01L 23/3114* (2013.01); *H01L 23/3171* (2013.01); *H01L 23/53204* (2013.01); *H01L 24/05* (2013.01); *H01L 24/32* (2013.01); *H01L 24/48* (2013.01); *H01L 2224/04042* (2013.01); *H01L 2224/04073* (2013.01); *H01L 2224/05* (2013.01)

(58) Field of Classification Search
CPC ......... H01L 24/05; H01L 24/32; H01L 24/48; H01L 2224/04042; H01L 2224/04073; H01L 2224/05; H01L 27/222; H01L 43/00
USPC ........................................................ 257/421
See application file for complete search history.

(56) References Cited

U.S. PATENT DOCUMENTS

| | | |
|---|---|---|
| 2004/0021382 A1 | 2/2004 | Steinmeyer |
| 2004/0207086 A1* | 10/2004 | Leuschner ............. G11C 11/16 257/758 |
| 2009/0050991 A1 | 2/2009 | Nagai et al. |
| 2012/0181640 A1 | 7/2012 | von Koblinski et al. |
| 2014/0167193 A1 | 6/2014 | Iuliano et al. |
| 2015/0311901 A1 | 10/2015 | Bromberg et al. |
| 2017/0365755 A1 | 12/2017 | Chu |
| 2018/0366536 A1 | 12/2018 | Hsu et al. |
| 2019/0203564 A1 | 7/2019 | Henschel, Jr. et al. |
| 2020/0006465 A1 | 1/2020 | Ku et al. |

OTHER PUBLICATIONS

U.S. Notice of Allowance for U.S. Appl. No. 16/933,062, dated Sep. 16, 2021.

* cited by examiner

SEMICONDUCTOR DEVICE STRUCTURE WITH MAGNETIC ELEMENT COVERED BY POLYMER MATERIAL

PRIORITY CLAIM AND CROSS-REFERENCE

This Application is a Divisional of U.S. application Ser. No. 16/432,625, filed on Jun. 5, 2019, which claims the benefit of U.S. Provisional Application No. 62/725,695, filed on Aug. 31, 2018, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
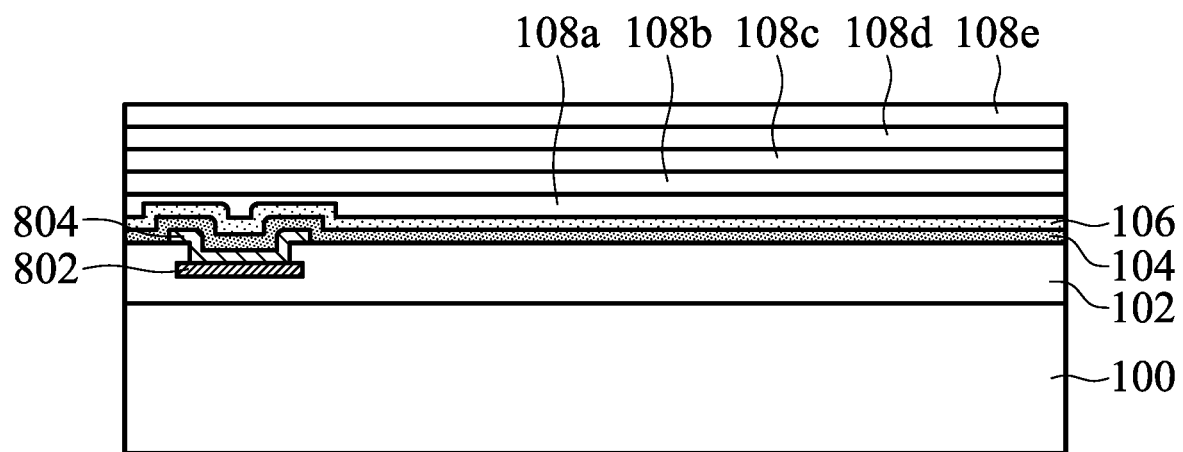
FIGS. 1A-1J are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1J are cross-sectional views of various stages of a process for forming a semiconductor device structure, in accordance with some embodiments. As shown in FIG. 1A, a semiconductor substrate 100 is received or provided. The semiconductor substrate 100 may include a semiconductor wafer with multiple device elements formed therein. For example, the semiconductor substrate 100 is a silicon wafer with transistors formed therein.

In some embodiments, an interconnection structure 102 is formed over the semiconductor substrate 100. The interconnection structure 102 may include multiple dielectric layers and multiple conductive features. These conductive features form electrical connections between the device elements and other elements to be formed later. For example, the interconnection structure 102 includes a conductive layer 802 and a conductive pad 804, as shown in FIG. 1A. In some embodiments, the topmost dielectric layer of the interconnection structure 102 is made of or includes a passivation layer. In some embodiments, the passivation layer is made of or includes a polymer material. For example, the polymer material is polyimide or one or more other suitable polymers.

As shown in FIG. 1A, a protective layer 104 is deposited over the interconnection structure 102, in accordance with some embodiments. The protective layer 104 may be used to protect the interconnection structure 102 (including the passivation layer of the interconnection structure 102) during a subsequent etching process for improving the quality of magnetic elements. In some embodiments, the protective layer 104 is in direct contact with the interconnection structure 102. In some other embodiments, one or more other material layers are formed between the protective layer 104 and the interconnection structure 102.

In some embodiments, the protective layer 104 is a single layer. In some other embodiments, the protective layer 104 includes multiple sub-layers. The sub-layers may be made of the same material. Alternatively, some of the sub-layers are made of different materials.

The protective layer 104 may be made of or include silicon nitride, silicon oxide, silicon oxynitride, silicon carbide, one or more other suitable materials, or a combination thereof. The protective layer 104 may be deposited using a chemical vapor deposition (CVD) process, an atomic layer deposition (ALD) process, a physical vapor deposition (PVD) process, a spin coating process, one or more other applicable processes, or a combination thereof.

The protective layer 104 may have a thickness that is in a range from 0.1 μm to about 3 μm. In some cases, if the protective layer 104 is thinner than about 0.1 μm, the protective layer 104 may be too thin to protect the interconnection structure 102 underneath. In some other cases, if the protective layer 104 is thicker than about 3 μm, the stress of the protective layer 104 may be too high. The protective layer 104 may become broken or delaminated due to the high stress, which may negatively affect the quality and reliability of the semiconductor device structure.

However, many variations and/or modifications can be made to embodiments of the disclosure. In some other embodiments, the protective layer 104 has a different thickness range. In some other embodiments, the protective layer 104 is not formed.

As shown in FIG. 1A, an etch stop layer 106 is deposited over the protective layer 104, in accordance with some embodiments. The etch stop layer 106 may protect the protective layer 104 and the interconnection structure 102 thereunder from being damaged during a subsequent etching process for forming magnetic elements. In some embodiments, the etch stop layer 106 is a single layer. In some other embodiments, the etch stop layer 106 includes multiple sub-layers. The sub-layers may be made of the same material. Alternatively, some of the sub-layers are made of different materials.

In some embodiments, the etch stop layer 106 and the protective layer 104 are made of different materials. The etch stop layer 106 may be made of or include tantalum oxide, zirconium oxide, tantalum nitride, one or more other suitable materials, or a combination thereof. In some embodiments, the etch stop layer 106 is deposited using a CVD process, an ALD process, a PVD process, one or more other applicable processes, or a combination thereof. In some other embodiments, a metal layer is deposited over the interconnection structure 102. Afterwards, an oxidation process and/or a nitridation process are used to transform the metal layer into the etch stop layer 106.

As shown in FIG. 1A, two or more magnetic layers (such as magnetic layers 108a-108e) are sequentially deposited over the etch stop layer 106, in accordance with some embodiments. These magnetic layers 108a-108e will be patterned later to form one or more magnetic elements. In some embodiments, the magnetic layers 108a-108e are made of the same material. In some other embodiments, some of the magnetic layers 108a-108e are made of different materials. In some embodiments, each of the magnetic layers 108a-108e has the same thickness. In some other embodiments, some of the magnetic layers 108a-108e have different thicknesses.

In some embodiments, the magnetic layers 108a-108e contain cobalt, zirconium, tantalum, iron, nickel, one or more other elements, or a combination thereof. The magnetic layers 108a-108e may be made of or include an alloy containing cobalt, zirconium, and tantalum (CZT), an alloy containing cobalt and zirconium, an alloy containing iron and nickel, one or more other suitable materials, or a combination thereof. The magnetic layers 108a-108e may be deposited using a PVD process, a CVD process, an ALD process, an electroplating process, an electroless plating process, one or more other applicable processes, or a combination thereof.

Figure 1B:
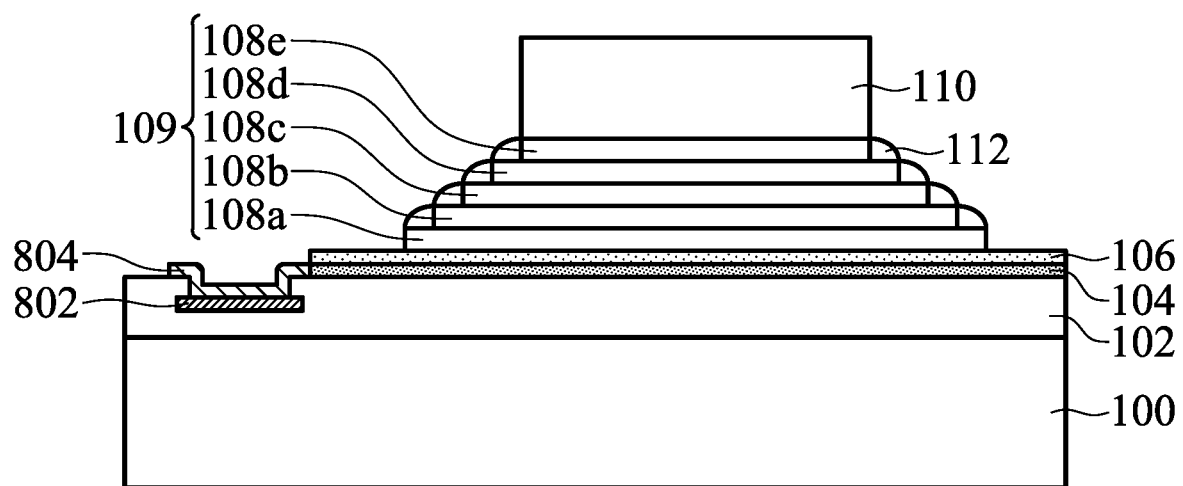

As shown in FIG. 1B, a patterned mask layer 110 is formed over the magnetic layer 108e, in accordance with some embodiments. The patterned mask layer 110 is used to assist in a subsequent patterning process of the magnetic layers 108a-108e. In some embodiments, the patterned mask layer 110 is a patterned photoresist layer. A photolithography process may be used to form the patterned mask layer 110 with the desired pattern. For example, the top view of the patterned mask layer 110 may have a square shape, a rectangular shape, or another suitable shape.

Afterwards, the magnetic layers 108a-108e are partially removed, as shown in FIG. 1B in accordance with some embodiments. As a result, the remaining portions of the magnetic layers 108a-108e together form a magnetic element 109. In some embodiments, with the patterned mask layer 110 as an etching mask, an etching process is used to partially remove the magnetic layers 108a-108e. In some embodiments, the etching process is a wet etching process. The etchant used in the wet etching process may include nitric acid, hydrochloric acid, hydrofluoric acid, one or more other suitable etchants, or a combination thereof. For example, a mixture of nitric acid, hydrochloric acid, and hydrofluoric acid is used as the etchant in the wet etching process. The etch stop layer 106 and the protective layer 104 may protect the interconnection structure 102 from being damaged during the wet etching process for patterning the magnetic layers 108a-108e.

In some cases, due to the characteristics of the magnetic layers 108a-108e and the wet etching process, hollow structures 112 may be formed at sidewall surfaces of the magnetic element 109, as shown in FIG. 1B. The hollow structures 112 may include voids inside, which might negatively affect the quality and reliability of the formed magnetic element 109.

Figure 1C:
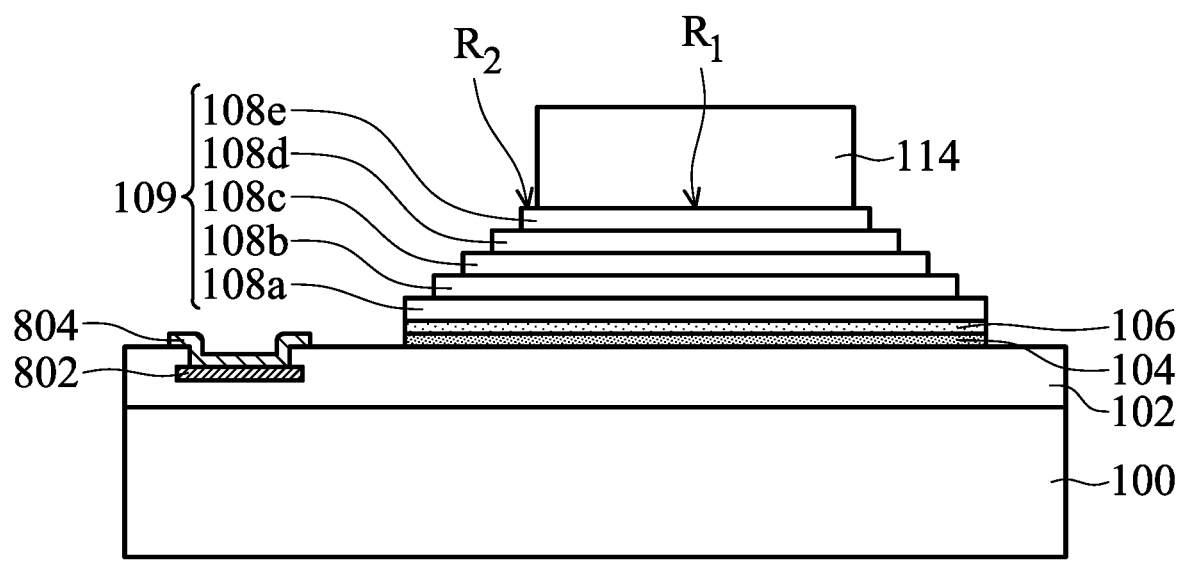

As shown in FIG. 1C, the patterned mask layer 110 is removed, and a new mask element 114 is then formed to partially cover the top surface of the magnetic element 109, in accordance with some embodiments. The material and formation method of the mask element 114 may be the same as or similar to those of the patterned mask layer 110. In some embodiments, the magnetic element 109 includes a stack of multiple magnetic layers 108a-108e. In some embodiments, the topmost magnetic layer (i.e., the magnetic layer 108e) is wider than the mask element 114.

In some embodiments, the mask element 114 covers a center region $R_1$ of the topmost magnetic layer 108e, as shown in FIG. 1C. The topmost magnetic layer 108e has a periphery region $R_2$ that is not covered by the mask element 114. The periphery region $R_2$ of the topmost magnetic layer 108e surrounds the center region $R_1$ of the topmost magnetic layer 108e.

Afterwards, an etching process is performed to partially remove the magnetic element 109, as shown in FIG. 1C in accordance with some embodiments. In some embodiments, the etching process is a dry etching process that is capable of removing the hollow structures 112 (including voids) at the sidewall surfaces of the magnetic element 109. The etchant used in the dry etching process may include $CF_4$, another suitable etchant, or a combination thereof. In some embodiments, due to the protection of the protective layer 104, the dry etching process is allowed to be performed for a longer period of time to ensure a complete removal of the hollow structures 112. Since the hollow structures 112 are removed, the quality and reliability of the magnetic element 109 are improved.

In some embodiments, the etching process used for removing the hollow structures 112 also partially remove the etch stop layer 106 and the protective layer 104. Alternatively, in some other embodiments, another etching process is used to remove the protective layer 104 or the etch stop layer 106. As a result, a portion of the interconnection structure 102 is exposed, as shown in FIG. 1C in accordance with some embodiments. For example, the passivation layer of the interconnection structure 102 is exposed. In some embodiments, one or more conductive pads (such as the conductive pad 804) formed in or on the interconnection structure 102 are exposed. Other conductive features such as redistribution layers may be formed later to connect the exposed conductive pads.

Figure 1D:
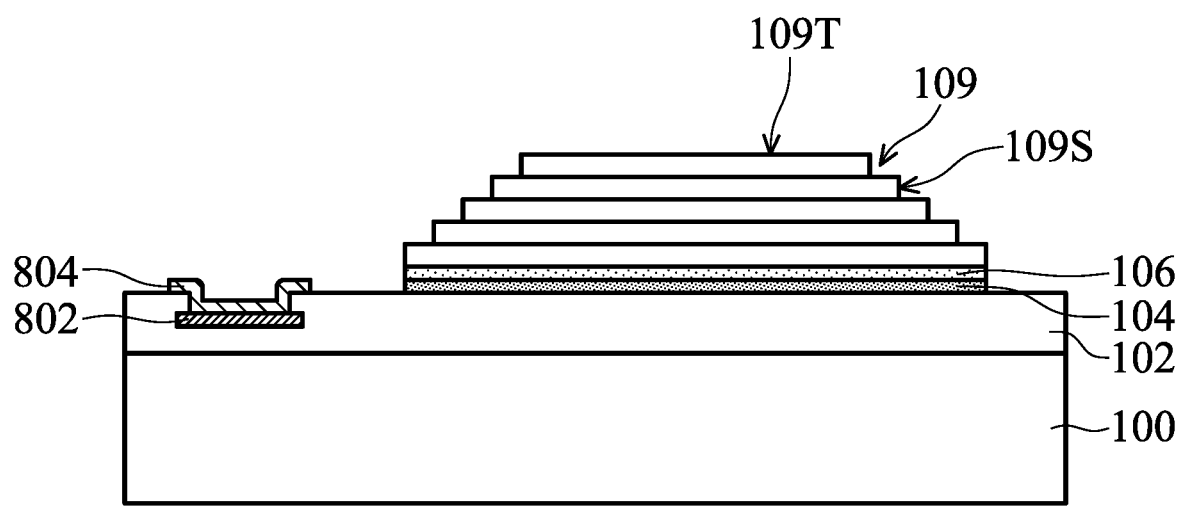

Afterwards, the mask element 114 is removed to expose the top surface 109T of the magnetic element 109, as shown in FIG. 1D in accordance with some embodiments. As shown in FIG. 1D, sidewall surfaces 109S of the magnetic element 109 have stair-like profiles. The magnetic element 109 includes multiple sub-layers (108*a*-108*e*), and each sub-layer is larger or wider than the sub-layer above it, as shown in FIG. 1D in accordance with some embodiments.

Figure 4:
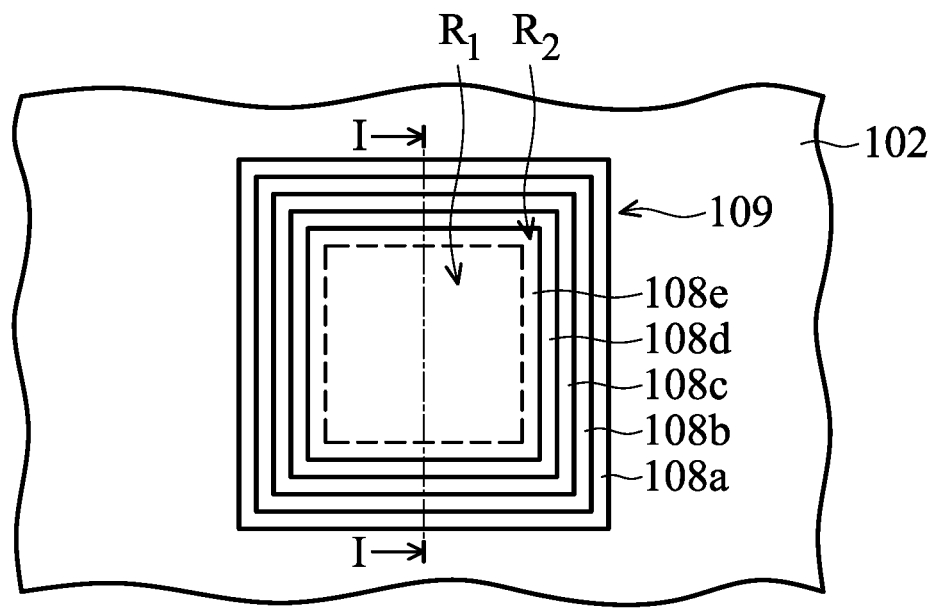
FIG. 4 is a top layout view of an intermediate stage of a process for forming a semiconductor device structure, in accordance with some embodiments.

FIG. 4 is a top layout view of an intermediate stage of a process for forming a semiconductor device structure, in accordance with some embodiments. In some embodiments, FIG. 4 is a top layout view of a portion of the structure shown in FIG. 1D. In some embodiments, a portion of the structure shown in FIG. 1D (without including the conductive pad 804) is taken along line I-I in FIG. 4.

In some embodiments, the magnetic element 109 has multiple sub-layers such as the magnetic layers 108*a*-108*e*. In some embodiments, each of the sub-layers is larger than the sub-layer above it, as shown in FIGS. 1D and 4. For example, the magnetic layer 108*a* is larger than the magnetic layer 108*b*. Similarly, the magnetic layer 108*d* is larger than the magnetic layer 108*e*.

Figure 1E:
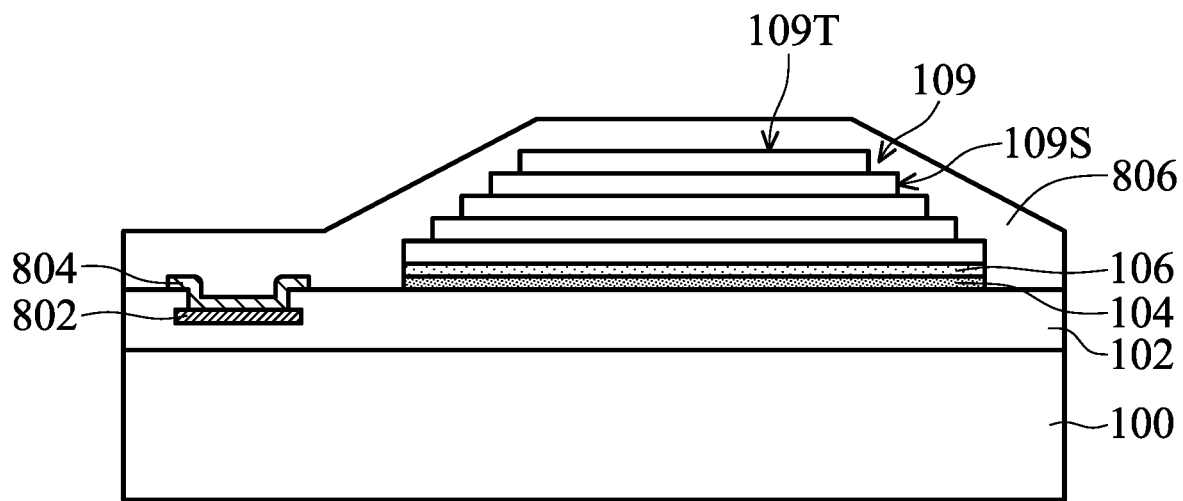

As shown in FIG. 1E, an isolation layer 806 is formed over the interconnection structure 102, the conductive pad 804, and the magnetic element 109, in accordance with some embodiments. In some embodiments, the isolation layer 806 covers an entirety of a top surface of the magnetic element 109. In some embodiments, the isolation layer 806 is in direct contact with the interconnection structure 102. For example, the isolation layer 806 is in direct contact with the passivation layer of the interconnection structure 102. In some embodiments, the isolation layer 806 is in direct contact with the conductive pad 804 and the magnetic element 109.

The isolation layer 806 may be made of or include a polymer material. Therefore, the isolation layer 806 may have a lower stress than other material layer that is made of silicon nitride. The polymer material may include polyimide, one or more other suitable polymers, or a combination thereof. The isolation layer 806 may be deposited using a spin coating process, a spray coating process, a lamination process, one or more other applicable processes, or a combination thereof. In some embodiments, the isolation layer 806 is formed directly on the magnetic element 109 using a spin coating process.

In some embodiments, the isolation layer 806 includes a first polymer material, and the passivation layer of the interconnection structure 102 includes a second polymer material. In some embodiments, since both the isolation layer 806 and the passivation layer of the interconnection structure 102 are made of polymer materials, the adhesion between the isolation layer 806 and the passivation layer of the interconnection structure 102 is high. In some embodiments, both the isolation layer 806 and the passivation layer of the interconnection structure 102 include or are made of the same polymer material such as polyimide. The adhesion between the isolation layer 806 and the passivation layer of the interconnection structure 102 is further improved. The isolation layer 806 may also function as a stress buffer layer. A cracking of the isolation layer 806 near the corner of the magnetic element 109 may be prevented.

In some other cases where the isolation layer is made of silicon nitride or silicon oxynitride having no polymer material, a delamination or a cracking may occur between the isolation layer and the passivation layer of the interconnection structure 102. For example, delamination may occur at the position that is between the isolation layer 806 and the interconnection structure 102 and near the magnetic element 109. Alternatively, the conductive pad formed in or over the interconnection structure 102 may be damaged due to the high stress of the isolation layer. For example, the isolation layer may shrink and cause delamination between the isolation layer and a passivation layer (such as a polyimide layer) of the interconnection structure 102. The isolation layer may also be broken.

In some embodiments, the adhesion between the isolation layer 806 and the magnetic element 109 is also improved due to the material characteristics of the isolation layer 806. The good adhesion may help to ensure that no or substantially no delamination would occur between the isolation layer 806 and the magnetic element 109. The isolation layer 806 has a low stress and may also function as a stress buffer layer. Therefore, the isolation layer 806 may also help to prevent delamination between the magnetic layers 108*a*-108*e*. The performance and reliability of the semiconductor device structure are improved.

Figure 1F:
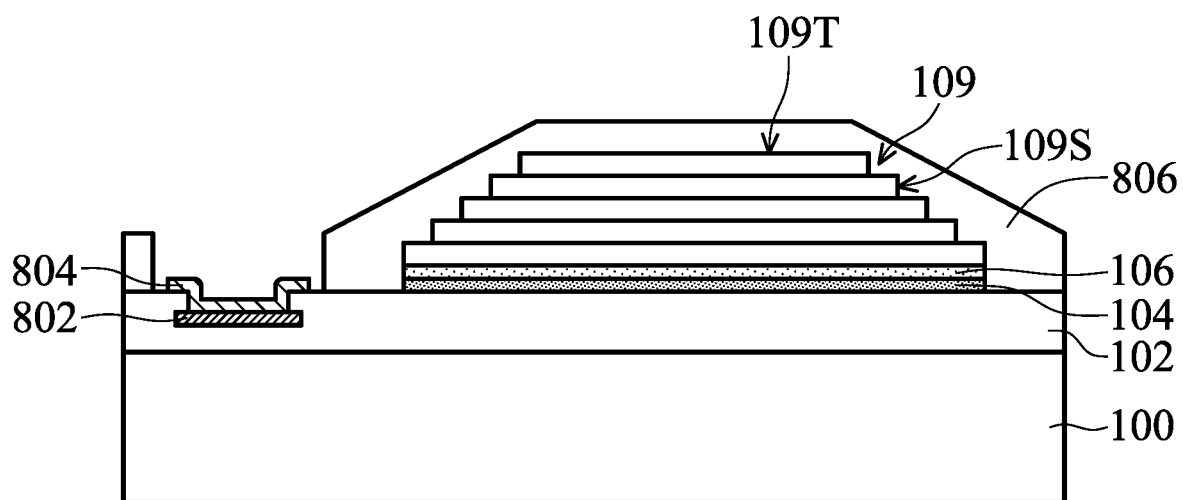

As shown in FIG. 1F, the isolation layer 806 is patterned to form an opening that exposes the conductive pad 804 originally below the isolation layer 806, in accordance with some embodiments. The isolation layer 806 may be patterned using a photolithography process, an energy beam drilling process, one or more other applicable processes, or a combination thereof. The energy beam drilling process may involve partially drilling the isolation layer 806 using an ion beam, an electron beam, a plasma beam, one or more other suitable beams, or a combination thereof. In some embodiments, after the patterning of the isolation layer 806, the remaining isolation layer 806 still covers an entirety of the top surface of the magnetic element 109, as shown in FIG. 1F.

Figure 1G:
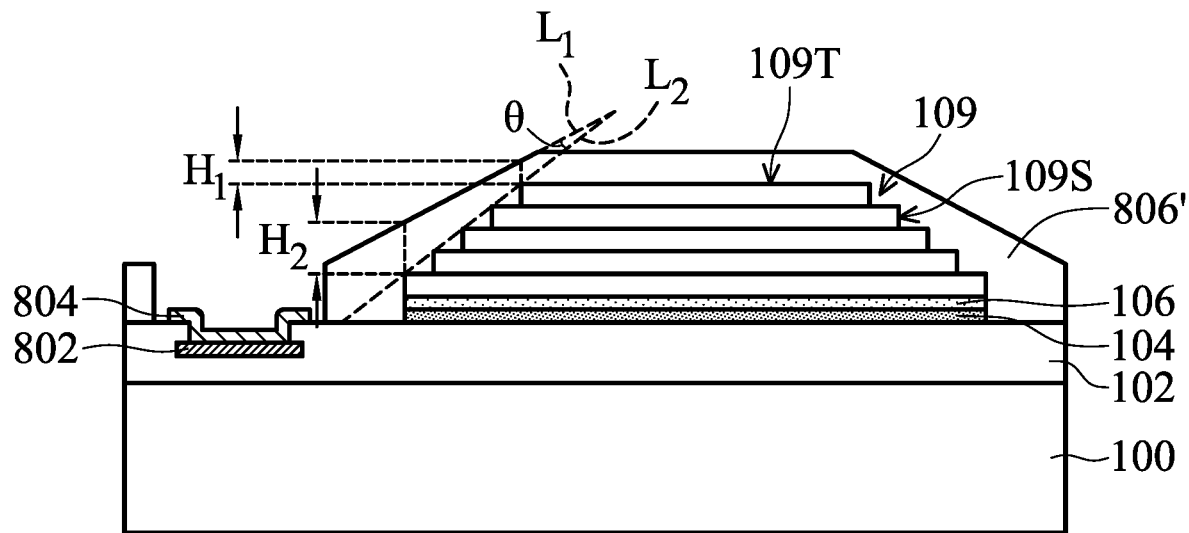

As shown in FIG. 1G, the isolation layer 806 is cured to form a cured isolation layer 806', in accordance with some embodiments. The isolation layer 806 may be cured using a thermal operation to form the cured isolation layer 806'. The thermal operation may be carried out at a temperature that is in a range from about 250 degrees C. to about 350 degrees C. for one or more hours. For example, the isolation layer 806 is cured at about 310 degrees C. for about four hours.

In some other embodiments, the isolation layer 806 is cured to form a cured isolation layer 806' using an illumination process. The illumination process may involve irradiate the isolation layer 806 using an ultraviolet light, a laser, one or more other suitable light sources, or a combination thereof. As a result, the cured isolation layer 806' is formed.

In some other embodiments, both the thermal curing process and the illumination process are used for curing the isolation layer 806.

However, many variations and/or modifications can be made to embodiments of the disclosure. In some other embodiments, the isolation layer 806 is not cured.

In some embodiments, due to the material characteristics of the isolation layer 806, the cured isolation layer 806' also has inclined side surfaces. The inclined profile of the cured isolation layer 806' may facilitate to subsequent formation processes. The reliability and performance of the semiconductor device structure are improved.

As shown in FIG. 1G, the thickness of the cured isolation layer 806' becomes greater along a direction from an upper portion towards a lower portion of the cured isolation layer 806', in accordance with some embodiments. As shown in FIG. 1G, the cured isolation layer 806' has a first thickness $H_1$ and a second thickness $H_2$. The first thickness $H_1$ is measured from one of the inclined side surfaces of the cured isolation layer 806' to an upper edge corner of the magnetic element 109. The second thickness $H_2$ is measured from the inclined side surface of the cured isolation layer 806' to a lower edge corner of the magnetic element 109. In some embodiments, the first thickness $H_1$ is greater than the second thickness $H_2$.

As shown in FIG. 1G, there are a first imaginary line $L_1$ passing through the inclined side surface of the cured isolation layer 806' and a second imaginary line $L_2$ passing through the topmost edge corner of the magnetic element 109. The first imaginary line $L_1$ and the second imaginary line $L_2$ together define an angle $\theta$. In some embodiments, the angle $\theta$ is in a range from about 5 degrees to about 25 degrees. In some other embodiments, the angle $\theta$ is in a range from about 10 degrees to about 20 degrees.

Figure 1H:
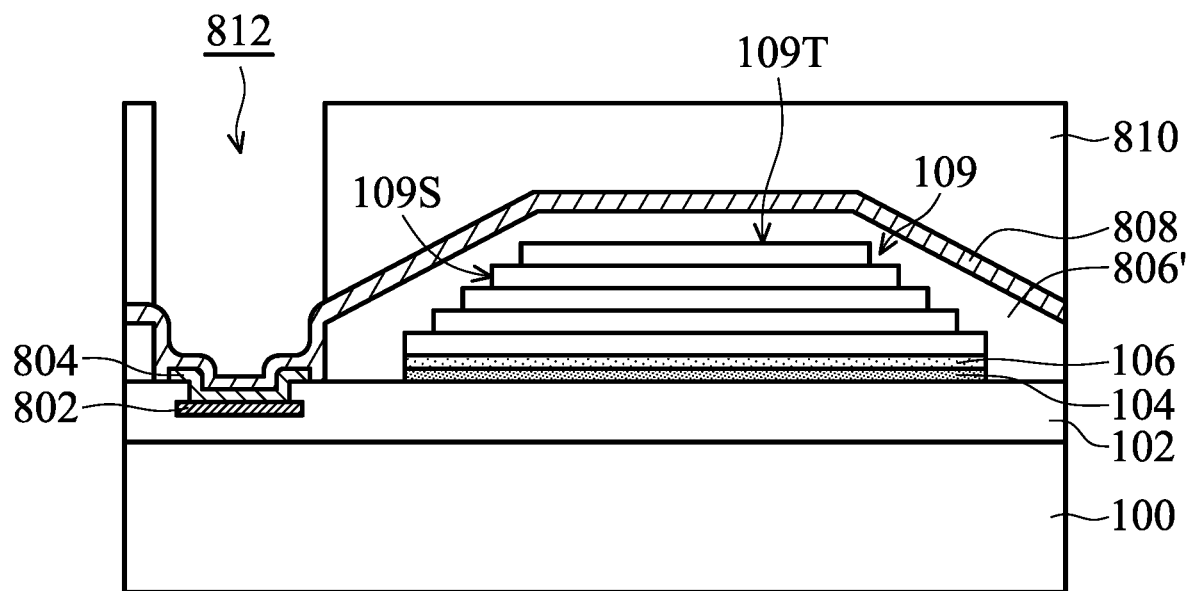

As shown in FIG. 1H, a seed layer 808 is deposited over the cured isolation layer 806' and the conductive pad 804, in accordance with some embodiments. The seed layer 808 may be used to assist in a subsequent plating process, such as an electroplating process. The seed layer 808 covers an entirety of the top surface of the magnetic element 109.

The seed layer 808 may be made of or include copper, aluminum, titanium, gold, cobalt, platinum, nickel, one or more other suitable materials, or a combination thereof. The seed layer 808 may be deposited using a PVD process, a CVD process, an ALD process, a lamination process, one or more other applicable processes, or a combination thereof.

Afterwards, a patterned mask layer 810 is formed over the seed layer 808, as shown in FIG. 1H in accordance with some embodiments. The patterned mask layer 810 has an opening 812 that exposes a portion of the seed layer 808 directly above the conductive pad 804. The patterned mask layer 810 includes one or more openings (including the opening 812) that expose portions of the seed layer 808 where one or more conductive lines will be formed later. The patterned mask layer 810 may be a patterned photoresist layer. The formation of the patterned mask layer 810 may involve a photolithography process.

Figure 1I:
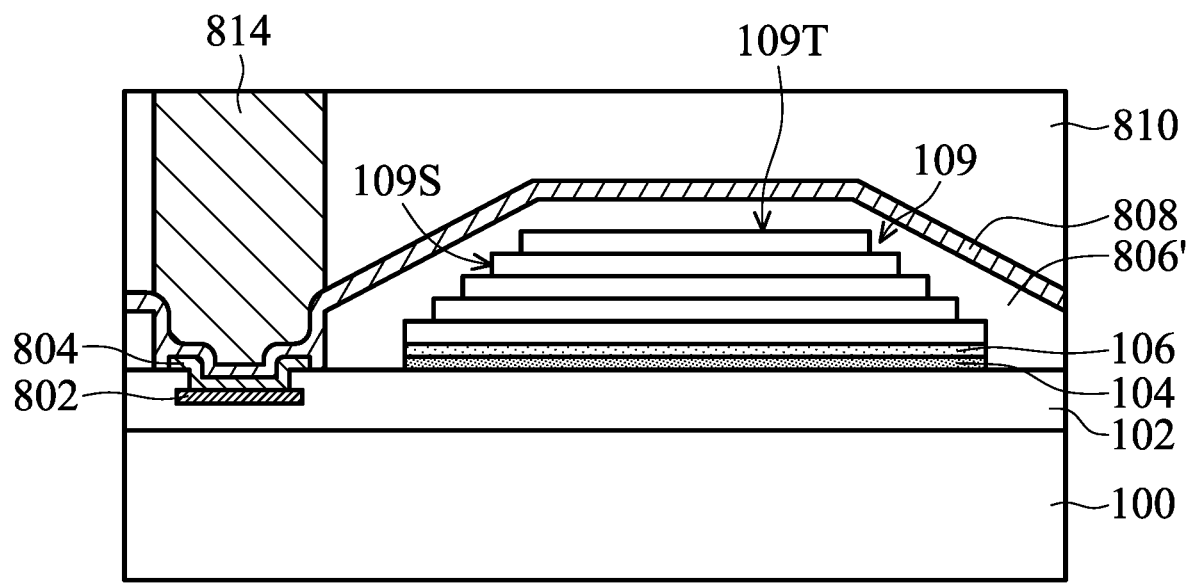

As shown in FIG. 1I, a conductive line 814 is formed over the exposed portions of the seed layer 808, in accordance with some embodiments. The conductive line 814 may be made of or include copper, gold, cobalt, one or more other suitable materials, or a combination thereof. The conductive line 814 may be formed using an electroplating process, an electroless plating process, one or more other applicable processes, or a combination thereof.

Figure 1J:
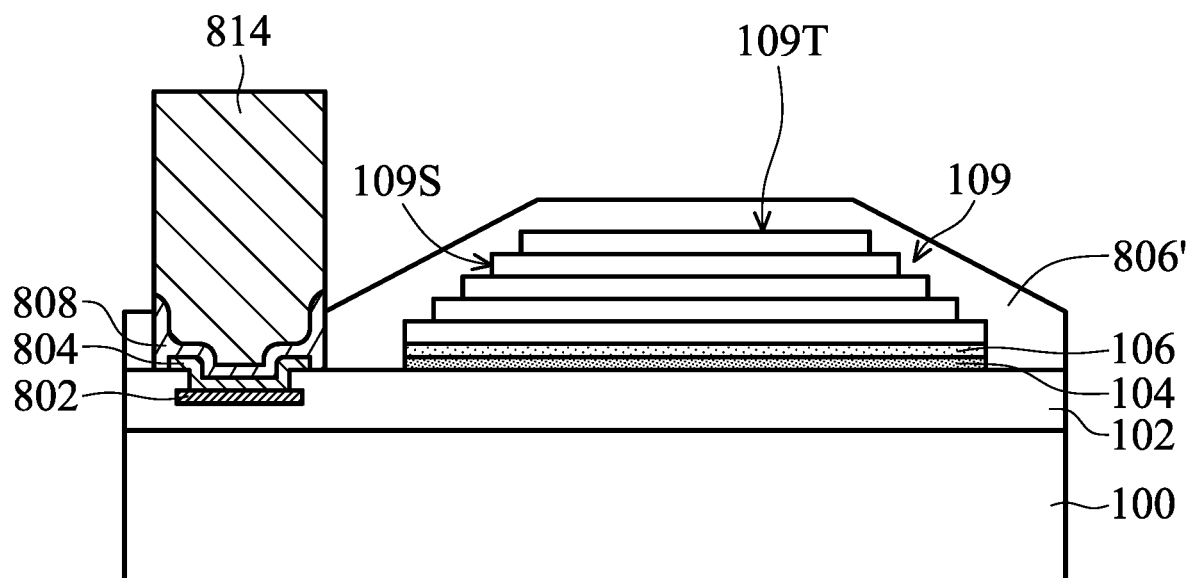

As shown in FIG. 1J, the patterned mask layer 810 is removed, in accordance with some embodiments. Afterwards, exposed portions of the seed layer 808 not covered by the conductive lines (such as the conductive line 814) are removed, as shown in FIG. 1J in accordance with some embodiments. An etching process may be used to remove the exposed portions of the seed layer 808.

In some embodiments, due to the protection of the cured isolation layer 806', the magnetic element 109 is protected from damage during the etching process for removing the exposed portions of the seed layer 808. The surface condition of the magnetic element 109 may be maintained in good condition. The quality and reliability of the magnetic element 109 are ensured.

Figure 3:
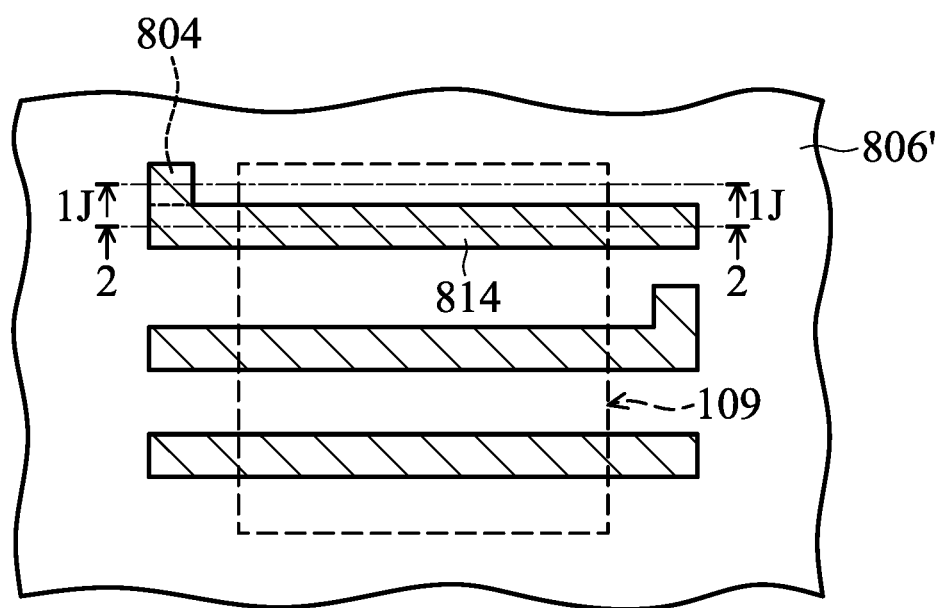
FIG. 3 is a top layout view of a semiconductor device structure, in accordance with some embodiments.

FIG. 3 is a top layout view of a semiconductor device structure, in accordance with some embodiments. In some embodiments, FIG. 3 is the top layout view of the structure shown in FIG. 1J. In some embodiments, the cross-sectional view of the structure shown in FIG. 1J is taken along the line 1J-1J of FIG. 3.

Figure 2:
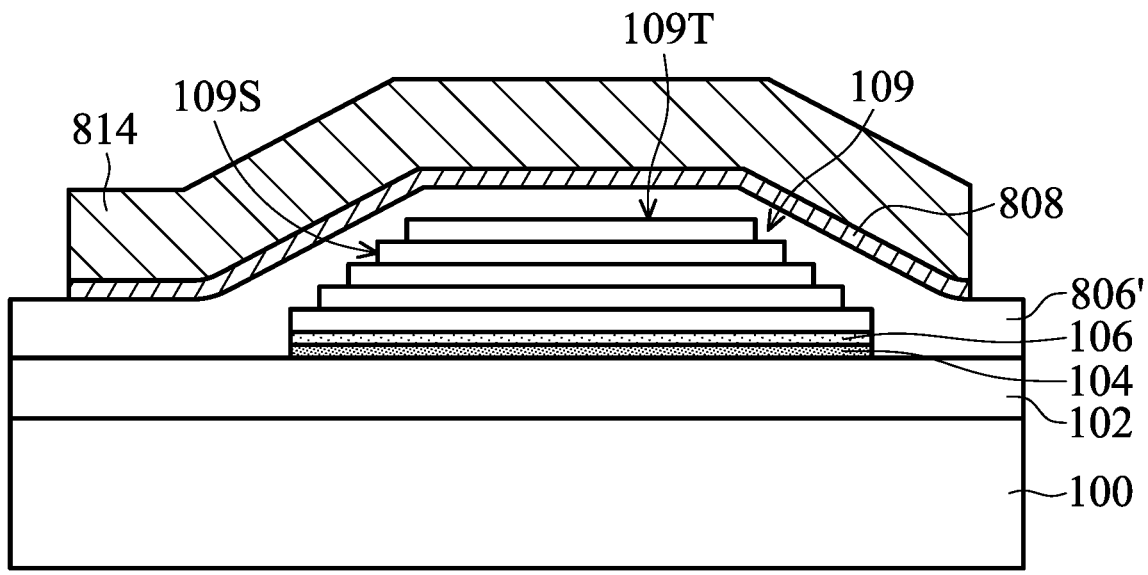
FIG. 2 is a cross-sectional view of a semiconductor device structure, in accordance with some embodiments.

FIG. 2 is a cross-sectional view of a semiconductor device structure, in accordance with some embodiments. In some embodiments, FIG. 3 is the top layout view of the structure shown in FIG. 2. In some embodiments, the cross-sectional view of the structure shown in FIG. 2 is taken along the line 2-2 of FIG. 3.

As shown in FIG. 2, the conductive line 814 extends across the magnetic element 109, in accordance with some embodiments. As shown in FIG. 3, multiple conductive lines 814 are formed over the cured isolation layer 806', in accordance with some embodiments. In some embodiments, each of the conductive lines 814 extends across the magnetic element 109 (that is under the cured isolation layer 806' and illustrated using dotted lines). The cured isolation layer 806' physically and/or electrically separate the magnetic element 109 from the conductive lines 814.

In some embodiments, these conductive lines 814 are electrically connected to each other. In some embodiments, each of the conductive lines 814 is electrically connected to other conductive lines formed above and below the magnetic element 109. These conductive lines (including the conductive lines 814) together surround the magnetic element 109. The conductive lines and the magnetic element 109 may together function as an inductor.

In some embodiments mentioned above, the formation of the conductive lines 814 involves using an electroplating process. Many variations and/or modifications can be made to embodiments of the disclosure. In some other embodiments, a metal layer is deposited using a PVD process, a CVD process, one or more other applicable processes, or a combination thereof. Afterwards, a photolithography process and an etching process are used to pattern the metal layer into the conductive lines 814.

Afterwards, multiple material layers and device elements may be formed over the structure as lustrated in FIGS. 1J, 2, and 3. Then, a dicing process may be performed to separate the structure into multiple semiconductor dies or die packages that are separate from each other.

Figure 5:
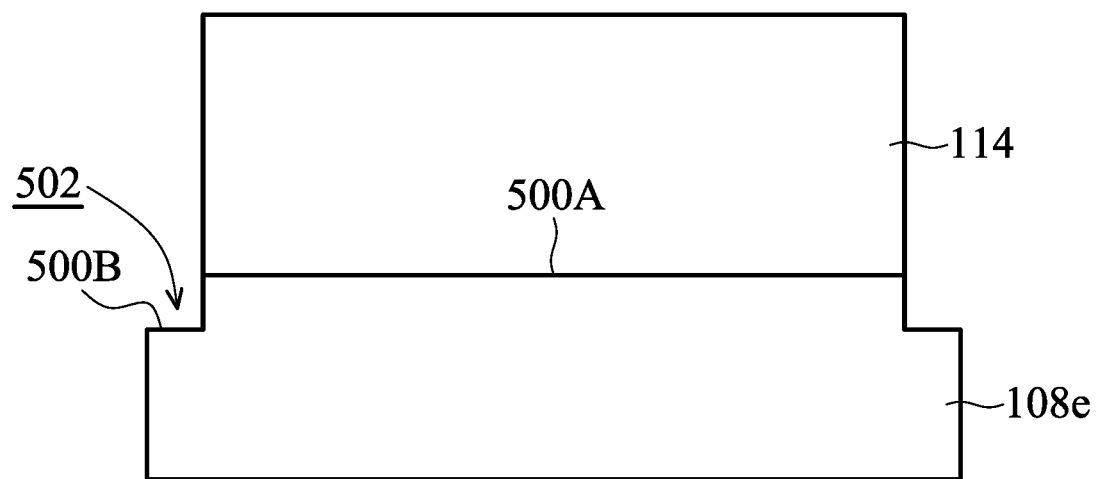
FIG. 5 is a cross-sectional view of a semiconductor device structure, in accordance with some embodiments.

Many variations and/or modifications can be made to embodiments of the disclosure. FIG. 5 is a cross-sectional view of a semiconductor device structure, in accordance with some embodiments. In some embodiments, FIG. 5 is an enlarged cross-sectional view showing a portion of the structure illustrated in FIG. 1C. In some embodiments, after the etching process for removing the hollow structures 112, portions of the top surface of the topmost magnetic layer 108e are recessed. As shown in FIG. 5, the magnetic layer 108e has a first portion 500A covered by the mask element 114 and a second portion 500B not covered by the mask element 114. After the etching process, the second portion 500B is recessed to a lower height level than the first portion 500A. In some embodiments, a recess 502 is thus formed. The recess 502 surrounds the first portion 500A. In some embodiments, the recess 502 is positioned at the region $K_2$ illustrated in FIG. 4. Therefore, the recess 502 surrounds the region $R_1$.

In some embodiments, the recess 502 has a width that is measured from a sidewall of the recess 502 to an edge of the magnetic layer 108e. The width may be in a range from about 5 µm to about 10 µm. In some cases, if the width is less than about 5 µm, the etching process for removing the hollow structures 112 may be negatively affected. Once an overlay shift occurs during the formation of the mask element 114, some of the hollow structures 112 may be covered by the mask element 114. As a result, the hollow structures 112 may not be removed completely, which may result in a performance degradation of the semiconductor device structure. In some other cases, if the width is greater than about 10 µm, not only the hollow structures 112 but also a greater portions of the magnetic element 109 may be removed, which may also result in a performance degradation of the semiconductor device structure.

Figure 6:
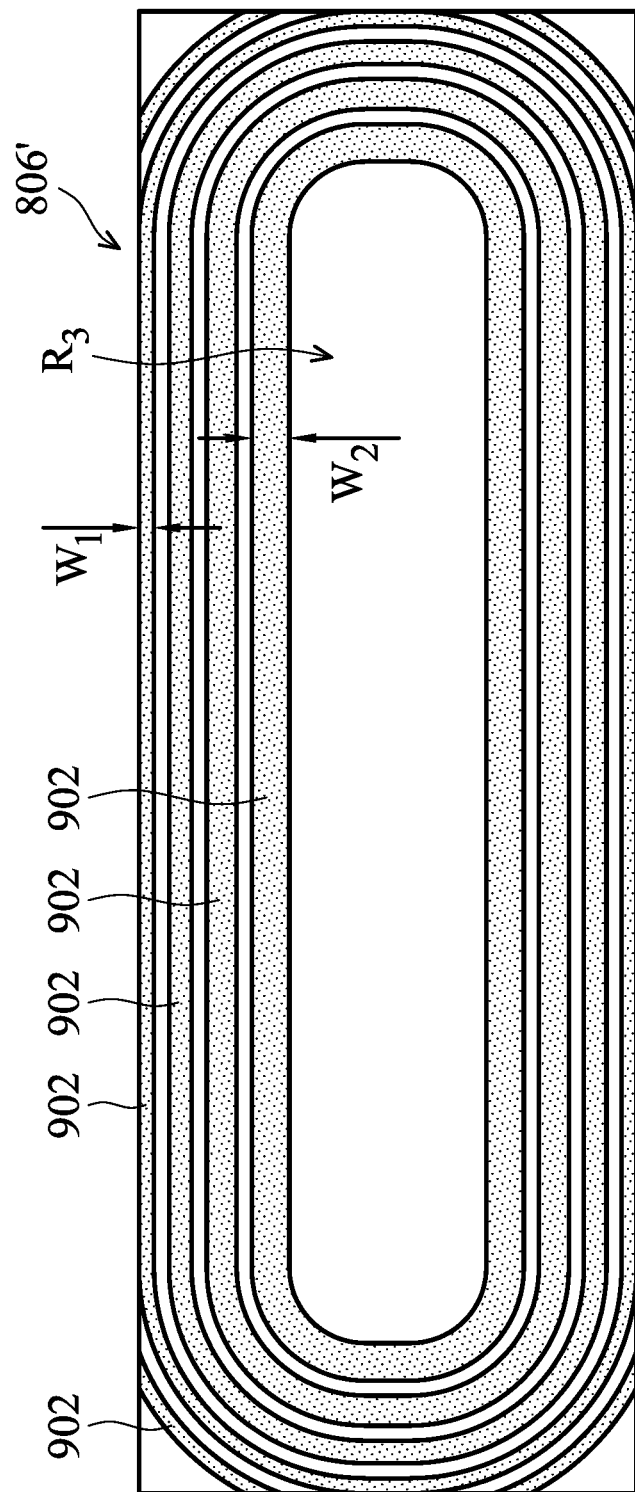
FIG. 6 is a top view of an isolation layer of a semiconductor device structure, in accordance with some embodiments.

FIG. 6 is a top view of an isolation layer of a semiconductor device structure, in accordance with some embodiments. In some embodiments, FIG. 6 is a top view of a portion or an entirety of the isolation layer 806' illustrated in FIG. 1G, 1J, 2, or 3. In some embodiments, due to the characteristics of the isolation layer 806', from the top view of the cured isolation layer 806', the cured isolation layer 806' includes one or more color rings 902 when the cured isolation layer 806' is observed under illumination of a visible light. The color rings 902 may include orange color, green color, yellow color, red color, another color, or a combination thereof.

In some embodiments, the cured isolation layer 806' has a thickness measured between the top surfaces of the cured isolation layer 806' and the magnetic element 109. The thickness may be in a range from about 1.5 µm to about 2.5 µm. In some embodiments, the thickness of the cured isolation layer 806' is not uniform. The thickness non-uniform characteristics of the cured isolation layer 806' may result in the color rings 902.

In some cases, if the thickness of the cured isolation layer 806' is smaller than about 1.5 µm, some portions of the magnetic element 109 may not be covered well and may be exposed. As a result, the magnetic element 109 may be in direct contact with a subsequently formed conductive line, which may result in function failure of the semiconductor device structure. In some other cases, if the thickness of the cured isolation layer 806' is greater than about 2.5 µm, the distance between the magnetic element 109 and a subsequently formed conductive line may be too large, which may result in a poor performance of the semiconductor device structure.

In some embodiments, some of the color rings 902 are continuous rings. In some embodiments, some of the color rings 902 are discontinuous rings. In some embodiments, the portion of the isolation layer 806' directly above the magnetic element 109 have about four to about six color rings. In some embodiments, widths of some of the color rings 902 are different from each other. In some embodiments, one of the color rings 902 that has a thinner width $W_1$ surrounds one of the color rings 902 that has a wider width $W_2$, as shown in FIG. 6. In some embodiments, the inner color ring 902 has a lighter color than the outer color ring 902. In some other embodiments, each of the color rings 902 is substantially as wide as each other. One of the color rings 902 surrounds one or more other color rings 902. In some embodiments, the most inner color ring 902 surrounds an oval-like area $R_3$, as shown in FIG. 6.

Embodiments of the disclosure form a semiconductor device structure with a magnetic element. An isolation layer made of or including a polymer material is formed to cover the magnetic element. Due to the low stress and good adhesion characteristics of the isolation layer, the magnetic element is protected. Delamination, cracking, and/or damage of the magnetic element and/or other nearby material layers are significantly reduced. The quality, performance, and reliability of the semiconductor device structure are significantly improved.

In accordance with some embodiments, a method for forming a semiconductor device structure is provided. The method includes forming a passivation layer over a semiconductor substrate. The method also includes forming a magnetic element over the passivation layer. The method further includes forming an isolation layer over the magnetic element and the passivation layer. The isolation layer includes a polymer material. In addition, the method includes forming a conductive line over the isolation layer, and the conductive line extends across the magnetic element.

In accordance with some embodiments, a method for forming a semiconductor device structure is provided. The method includes forming a first polymer layer over a semiconductor substrate and forming a magnetic element over the first polymer layer. The method also includes forming a second polymer layer over the first polymer layer to cover the magnetic element. The method further includes forming a conductive line over the second polymer layer. The conductive line extends across the magnetic element.

In accordance with some embodiments, a semiconductor device structure is provided. The semiconductor device structure includes a semiconductor substrate and a magnetic element over the semiconductor substrate. The semiconductor device structure also includes a passivation layer between the semiconductor substrate and the magnetic element. The semiconductor device structure further includes an isolation layer over the magnetic element and the passivation layer, and the isolation layer comprises a polymer material. In addition, the semiconductor device structure includes a conductive line over the isolation layer and extending across the magnetic element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device structure, comprising:
a semiconductor substrate;
a magnetic element over the semiconductor substrate;
a passivation layer between the semiconductor substrate and the magnetic element;

an isolation layer over the magnetic element and the passivation layer, wherein the isolation layer comprises a polymer material; and
a conductive line over the isolation layer and extending across the magnetic element.

2. The semiconductor device structure as claimed in claim 1, wherein from a top view of the isolation layer, the isolation layer comprises at least one color ring when the isolation layer is observed under illumination of a visible light.

3. The semiconductor device structure as claimed in claim 1, wherein the passivation layer and the isolation layer each comprises polyimide.

4. The semiconductor device structure as claimed in claim 1, wherein the magnetic element comprises multiple sub-layers, and each sub-layer is larger than another sub-layer above it.

5. The semiconductor device structure as claimed in claim 1, wherein the isolation layer is in direct contact with the magnetic element.

6. The semiconductor device structure as claimed in claim 1, wherein the isolation layer is in direct contact with the passivation layer.

7. The semiconductor device structure as claimed in claim 1, wherein an entirety of a top surface of the magnetic element is covered by the isolation layer.

8. The semiconductor device structure as claimed in claim 1, further comprising a pad structure over the semiconductor substrate, wherein the conductive line is electrically connected to the pad structure.

9. The semiconductor device structure as claimed in claim 1, further comprising an etch stop layer between the magnetic element and the semiconductor substrate.

10. The semiconductor device structure as claimed in claim 1, wherein the magnetic element comprises multiple sub-layers, a topmost sub-layer of the magnetic element has a periphery portion and a center portion, the periphery portion laterally surrounds the center portion, and the center portion is thicker than the periphery portion.

11. A semiconductor device structure, comprising:
a semiconductor substrate;
a magnetic element over the semiconductor substrate;
a first polymer-containing layer between the semiconductor substrate and the magnetic element;
a second polymer-containing layer over the magnetic element and the first polymer-containing layer; and
a conductive line over the isolation layer and extending across the magnetic element.

12. The semiconductor device structure as claimed in claim 11, wherein from a top view of the second polymer-containing layer, the second polymer-containing layer has a plurality of color rings when the second polymer-containing layer is observed under illumination of a visible light.

13. The semiconductor device structure as claimed in claim 11, wherein the second polymer-containing layer has a first portion in direct contact with a topmost surface of the magnetic element, the second polymer-containing layer has a second portion in direct contact with the first polymer-containing layer, and the second portion is thicker than the first portion.

14. The semiconductor device structure as claimed in claim 11, wherein the magnetic element comprises multiple sub-layers, a topmost sub-layer of the magnetic element has a periphery portion and a center portion, the periphery portion laterally surrounds the center portion, and the center portion is thicker than the periphery portion.

15. The semiconductor device structure as claimed in claim 11, wherein the magnetic element comprises multiple sub-layers, and each sub-layer is wider than another sub-layer above it.

16. A semiconductor device structure, comprising:
a semiconductor substrate;
a magnetic element over the semiconductor substrate;
an isolation layer covering the magnetic element and a portion of the semiconductor substrate, wherein the isolation layer contains a polymer material; and
a conductive line over the isolation layer and extending exceeding edges of the magnetic element.

17. The semiconductor device structure as claimed in claim 16, wherein the magnetic element comprises multiple sub-layers, and each sub-layer is larger than another sub-layer above it.

18. The semiconductor device structure as claimed in claim 17, wherein sidewalls of the sub-layers are misaligned with each other.

19. The semiconductor device structure as claimed in claim 17, wherein the isolation layer is in direct contact with the sidewalls of the sub-layers.

20. The semiconductor device structure as claimed in claim 16, wherein from a top view of the isolation layer, the isolation layer has a plurality of color rings when the isolation layer is observed under illumination of a visible light, the color rings comprises an inner color ring and an outer color ring, and the inner color ring is laterally surrounded by the outer color ring.

\* \* \* \* \*